(12) United States Patent
Lee et al.

(10) Patent No.: US 12,002,868 B2
(45) Date of Patent: Jun. 4, 2024

(54) DISPLAY DEVICE AND METHOD OF MANUFACTURING THE SAME

(71) Applicant: Samsung Display Co., Ltd., Yongin-si (KR)

(72) Inventors: Dongsung Lee, Yongin-si (KR); Cheolho Park, Yongin-si (KR); Jongoh Seo, Yongin-si (KR); Byungsoo So, Yongin-si (KR); Dongmin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 704 days.

(21) Appl. No.: 17/113,777

(22) Filed: Dec. 7, 2020

(65) Prior Publication Data
US 2021/0091201 A1    Mar. 25, 2021

Related U.S. Application Data

(62) Division of application No. 16/157,155, filed on Oct. 11, 2018, now Pat. No. 10,892,343.

(30) Foreign Application Priority Data

Oct. 13, 2017 (KR) .......................... 10-2017-0133472

(51) Int. Cl.
*H01L 29/45* (2006.01)
*H01L 27/12* (2006.01)
(Continued)

(52) U.S. Cl.
CPC .......... *H01L 29/458* (2013.01); *H01L 27/124* (2013.01); *H01L 29/401* (2013.01);
(Continued)

(58) Field of Classification Search
CPC . H01L 29/4908; H01L 29/66742–6678; H01L 29/786–78696; H01L 27/12–13;
(Continued)

(56) References Cited

U.S. PATENT DOCUMENTS

| | | | |
|---|---|---|---|
| 6,376,862 B1 | 4/2002 | Yamazaki | H01L 27/12 257/64 |
| 6,403,407 B1 | 6/2002 | Andry | H01L 27/1288 438/158 |

(Continued)

FOREIGN PATENT DOCUMENTS

| | | |
|---|---|---|
| JP | H06120503 A | 4/1994 |
| JP | 1996-116061 A | 5/1996 |

(Continued)

OTHER PUBLICATIONS

Korean Office Action for Korean Patent Application No. 10-2017-0133472 dated Apr. 17, 2023.

*Primary Examiner* — Moin M Rahman
(74) *Attorney, Agent, or Firm* — CANTOR COLBURN LLP

(57) ABSTRACT

A display device includes: a thin-film transistor on a substrate, the thin-film transistor including on the substrate: an active layer; a gate electrode overlapping the active layer; a source electrode and a drain electrode electrically connected to the active layer and including a first metal material; and a first capping layer which covers each of the source electrode and the drain electrode, the first capping layer having a Young's modulus greater than that of the first metal material.

9 Claims, 5 Drawing Sheets

(51) Int. Cl.
*H01L 29/40* (2006.01)
*H01L 29/49* (2006.01)
*H10K 10/82* (2023.01)
*H10K 10/84* (2023.01)
*H10K 71/00* (2023.01)
*H10K 71/20* (2023.01)

(52) U.S. Cl.
CPC ......... *H01L 29/4908* (2013.01); *H10K 10/82* (2023.02); *H10K 10/84* (2023.02); *H10K 71/236* (2023.02); *H10K 71/621* (2023.02); *Y10S 438/937* (2013.01)

(58) Field of Classification Search
CPC ... H01L 2924/13069; H01L 29/04–045; H01L 29/16–1608; H01L 29/18–185; H01L 29/22–2206; H01L 29/36–365; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 43/40; H01L 21/76831; H01L 21/76805; H01L 29/78; H01L 21/56; H01L 21/561; H01L 23/31; H01L 21/6836; H01L 21/6835; H01L 23/00; H01L 21/48; H01L 23/498; H01L 23/5389; H01L 25/065; H01L 21/486; H01L 22/14; H01L 22/20; H01L 22/32; H01L 23/3114; H01L 24/03; H01L 24/19; H01L 24/20; H01L 24/97; H01L 25/0657; H01L 21/78; H01L 23/3128; H01L 2221/68331; H01L 2224/18; H01L 23/49816; H01L 2224/73267; H01L 2221/68359; H01L 23/5384; H01L 2224/48227; H01L 2221/68345; H01L 2924/15311; H01L 2924/00014; H01L 2924/181; H01L 24/94; H01L 24/92; H01L 2224/9222; H01L 2224/05568; H01L 2224/04026; H01L 24/29; H01L 24/32; H01L 2224/04042; H01L 2224/32145; H01L 2224/32225; H01L 2224/73265; H01L 2224/97; H01L 24/48; H01L 2224/94; H01L 2224/12105; H01L 2224/04105; H01L 2924/14; H01L 2225/1035; H01L 2225/1058; H01L 25/105; H01L 2924/18162; H01L 2224/48091; H01L 21/4853; H01L 23/3185; H01L 23/4983; H01L 29/458; H01L 27/124; H01L 29/401; H01L 29/41733; H01L 29/42384; H10B 43/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H10K 59/124; H10K 59/125; H10K 59/126; H10K 59/127; H10K 10/82; H10K 10/84; H10K 71/236; H10K 71/621; H10K 59/1213; H10K 50/84; H10K 71/00; H10K 71/233; Y10S 438/937
See application file for complete search history.

(56) References Cited

U.S. PATENT DOCUMENTS

| | | | |
|---|---|---|---|
| 6,407,780 B1 | 6/2002 | Sung | G02F 1/136227 349/43 |
| 7,018,872 B2 | 3/2006 | Hirai | H01L 27/283 438/149 |
| 7,037,779 B2 | 5/2006 | Nakajima | H01L 21/02422 257/E21.413 |
| 7,893,440 B2 | 2/2011 | Kwon | H01L 27/1255 257/40 |
| 8,138,547 B2 | 3/2012 | Guo | H01L 29/78624 257/347 |
| 8,349,669 B2 | 1/2013 | Ye | H01L 21/02521 438/149 |
| 8,441,042 B2 | 5/2013 | Tyberg | H01L 23/5226 257/213 |
| 8,525,174 B2 | 9/2013 | You et al. | |
| 8,614,441 B2 | 12/2013 | Koo | H01L 51/0512 257/40 |
| 8,766,372 B2 | 7/2014 | Kuhn | H01L 21/76874 257/388 |
| 8,773,628 B2 | 7/2014 | Inoue | C23C 14/3414 349/139 |
| 8,853,017 B2 | 10/2014 | Nomoto | H01L 51/0021 257/E51.007 |
| 9,299,941 B2 | 3/2016 | Lee | H01L 51/105 |
| 9,355,838 B2 | 5/2016 | Wang | H01L 21/02252 |
| 9,508,782 B2 | 11/2016 | Park | H01L 27/3265 |
| 9,698,206 B2 | 7/2017 | You | H01L 27/3258 |
| 2005/0156163 A1 | 7/2005 | Hirai | H01L 51/10 257/40 |
| 2005/0158926 A1 | 7/2005 | Kim | H01L 27/124 438/151 |
| 2006/0046326 A1 | 3/2006 | Kok | H01L 27/1214 438/21 |
| 2006/0141136 A1 | 6/2006 | Miyazawa | C23C 14/042 427/66 |
| 2007/0108448 A1 | 5/2007 | Kaitoh | H01L 27/1285 257/67 |
| 2008/0062344 A1 | 3/2008 | Yoshimoto | G02F 1/136286 349/43 |
| 2008/0251785 A1 | 10/2008 | Noh | H01L 27/3248 257/40 |
| 2009/0057764 A1 | 3/2009 | Okada | H01L 27/1285 257/347 |
| 2009/0286386 A1 | 11/2009 | Lee | H01L 23/53238 438/586 |
| 2010/0062556 A1* | 3/2010 | Sasagawa | H01L 27/1288 257/E21.414 |
| 2013/0082287 A1 | 4/2013 | Chen | |
| 2013/0181218 A1 | 7/2013 | Maeda | H01L 23/53238 257/43 |
| 2014/0118675 A1 | 5/2014 | Kimura | H01L 27/3248 349/138 |
| 2016/0104858 A1 | 4/2016 | You | H01L 27/3258 257/40 |
| 2016/0163878 A1 | 6/2016 | Kanegae | H01L 29/78693 257/43 |
| 2016/0181290 A1 | 6/2016 | Wang | |
| 2016/0204126 A1 | 7/2016 | Amano | H01L 29/78693 257/59 |
| 2016/0204175 A1 | 7/2016 | Kim | H01L 27/3258 257/40 |
| 2016/0247870 A1 | 8/2016 | Park | H01L 27/3265 |
| 2017/0005154 A1 | 1/2017 | You | H01L 27/3262 |
| 2017/0084751 A1 | 3/2017 | Kato | H01L 29/45 |
| 2017/0207326 A1 | 7/2017 | Saitoh | H01L 21/28 |

(56) References Cited

U.S. PATENT DOCUMENTS

| | | | |
|---|---|---|---|
| 2017/0236892 A1 | 8/2017 | Park | .................... H01L 27/3279 |
| | | | 257/40 |
| 2018/0120612 A1 | 5/2018 | Lius | .................... G02F 1/13624 |
| 2018/0122954 A1 | 5/2018 | Kim | ........................ H01L 29/45 |
| 2018/0149935 A1 | 5/2018 | Lee | ......................... G02F 1/133 |

FOREIGN PATENT DOCUMENTS

| | | | |
|---|---|---|---|
| JP | 2551724 | B2 | 8/1996 |
| JP | 2000349297 | A | 12/2000 |
| JP | 2003229437 | A | 8/2003 |
| KR | 20030025998 | A | 3/2003 |
| KR | 1020120020522 | A | 3/2012 |
| KR | 1020150033407 | A | 4/2015 |
| KR | 1020160044172 | A | 4/2016 |

* cited by examiner

DISPLAY DEVICE AND METHOD OF MANUFACTURING THE SAME

This application is a divisional application of U.S. application Ser. No. 16/157,155 filed Oct. 11, 2018, which claims priority to Korean Patent Application No. 10-2017-0133472, filed on Oct. 13, 2017, and all the benefits accruing therefrom under 35 U.S.C. § 119, the content of which is incorporated herein in its entirety by reference.

BACKGROUND

1. Field

One or more exemplary embodiments relate to a display device and method of manufacturing the same, and more particularly, to a display device including a thin-film transistor with improved function and reliability and a simplified manufacturing process thereof, and a method of manufacturing the same.

2. Description of the Related Art

An organic light-emitting display device has strong points such as a relatively wide viewing angle, excellent contrast and a relatively fast response speed, and thus, has received attention as a next-generation display device from among display devices.

In general, the organic light-emitting display device has thin-film transistors as switching elements and organic light-emitting diodes which are controlled using the thin-film transistors, arranged on a substrate. The organic light-emitting display device as a self-emissive display device operates with the organic light-emitting diode therein generating and emitting light used to display an image. The organic light-emitting display device is used as a display unit to display an image within relatively small products such as a mobile phone and also as a display unit to display an image within relatively large products such as a television ("TV").

SUMMARY

One or more exemplary embodiments include a display device including a thin-film transistor with improved function and reliability and a simplified manufacturing process, and a method of manufacturing the same. However, this is merely an example, and the scope of the present disclosure is not limited thereto.

Additional features will be set forth in part in the description which follows and, in part, will be apparent from the description, or may be learned by practice of the presented exemplary embodiments.

According to one or more exemplary embodiment, a display device includes a thin-film transistor on a substrate, the thin-film transistor including on the substrate: an active layer; a gate electrode overlapping the active layer; a source electrode and a drain electrode electrically connected to the active layer and including a first metal material; and a first capping layer which covers each of the source electrode and the drain electrode, the first capping layer including a second metal material having a Young's modulus greater than that of the first metal material.

The first capping layer may include titanium (Ti), molybdenum (Mo), or tungsten (W).

Each of the source electrode and the drain electrode may include an upper surface and a side surface which is connected to the upper surface, the first capping layer may overlap the upper surface of the source electrode and the drain electrode and the first capping layer overlapping the upper surface of the source electrode and the drain electrode may respectively extend along the side surface of the source electrode and the drain electrode to cover the upper surface and the side surface.

The source electrode and the drain electrode may include aluminum (Al).

The display device may further include: an interlayer dielectric layer between the gate electrode and each of the source electrode and the drain electrode, each of the source electrode and the drain electrode may include an upper surface and a side surface which extends from the upper surface, the first capping layer may overlap the upper surface of the source electrode and the drain electrode, and the first capping layer overlapping the upper surface of the source electrode and the drain electrode may respectively extend along the side surface of the source electrode and the drain electrode to contact the interlayer dielectric layer.

The active layer may include a first region overlapped by the gate electrode and a second region which is not overlapped by the gate electrode, and the second region may be doped with a same concentration of impurities as the first region.

The first region and the second region may be directly connected to each other.

The thin-film transistor may further include on the substrate: a second capping layer on the gate electrode to cover the gate electrode, and including Ti, Mo, or W.

The gate electrode may have an upper surface and a side surface which extends from the upper surface, the second capping layer may overlap the upper surface of the gate electrode and the first capping layer overlapping the upper surface of the gate electrode may extend along the side surface of the gate electrode to cover both the upper surface and the side surface.

The gate electrode may include Al.

The display device may further include: a gate insulating layer between the active layer and the gate electrode, and the second capping layer overlapping the upper surface may extend along the side surface of the gate electrode to contact the gate insulating layer.

According to one or more exemplary embodiments, a method of manufacturing a display device includes: forming a photoresist layer on a substrate by applying and patterning a photosensitive material on the substrate, the photoresist layer exposing portions of the substrate; forming a first conductive layer on the photoresist layer and the exposed portions of the substrate, the first conductive layer including a first metal material; etching a side surface of the photoresist layer having the first conductive layer thereon; forming a second conductive layer on the first conductive layer at the photoresist layer of which the side surface of etched and the exposed portions of the substrate, the second conductive layer including a second metal material having a Young's modulus greater than that of the first metal material; and removing the photoresist layer to form the second conductive layer covering the first conductive layer at the exposed portions of the substrate, the first conductive layer covered by the second conductive layer forming a conductive wiring of the display device.

The first conductive layer may include Al.

The second conductive layer may include Ti, Mo, or W.

The photoresist layer exposing portions of the substrate may include an upper surface and the side surface, the side surface extending from the upper surface, and in the forming of the first conductive layer, the first conductive layer may be disposed on the upper surface of the photoresist layer and on the exposed portions of the substrate to expose the side surface of the photoresist layer from the first conductive layer.

After the etching, a space may be defined between the etched side surface of the photoresist layer and the first conductive layer on the exposed portions of the substrate.

The first conductive layer on the exposed portions of the substrate may include an upper surface and a side surface which extends from the upper surface, and in the forming of the second conductive layer, the second conductive layer may be disposed on the upper surface of the first conductive layer and extend along the side surface thereof to cover both the upper surface and the side surface of the first conductive layer at the exposed portions of the substrate.

The first conductive layer including the first metal material covered by the second conductive layer including the second metal material may form a gate electrode, a source electrode or a drain electrode of a thin-film transistor of the display device.

The thin-film transistor may further include: forming the thin-film transistor on the substrate, including: forming an active layer on the substrate; forming the gate electrode on the active layer such that the gate electrode is disposed overlapping a first region of the active layer and disposed non-overlapping with a second region of the active layer; doping the second region of the active layer with a same concentration of impurities as the first region; and forming the source electrode and the drain electrode electrically connected to the active layer on the gate electrode, where the gate electrode, the source electrode and the drain electrode are formed by respective portions of the first conductive layer including the first metal material covered by the second conductive layer including the second metal material.

The first region and the second region may be directly connected to each other.

These general and specific embodiments may be implemented by using a system, a method, a computer program, or a combination thereof.

BRIEF DESCRIPTION OF THE DRAWINGS

These and/or other features will become apparent and more readily appreciated from the following description of the exemplary embodiments, taken in conjunction with the accompanying drawings in which.

DETAILED DESCRIPTION

Figure 1:
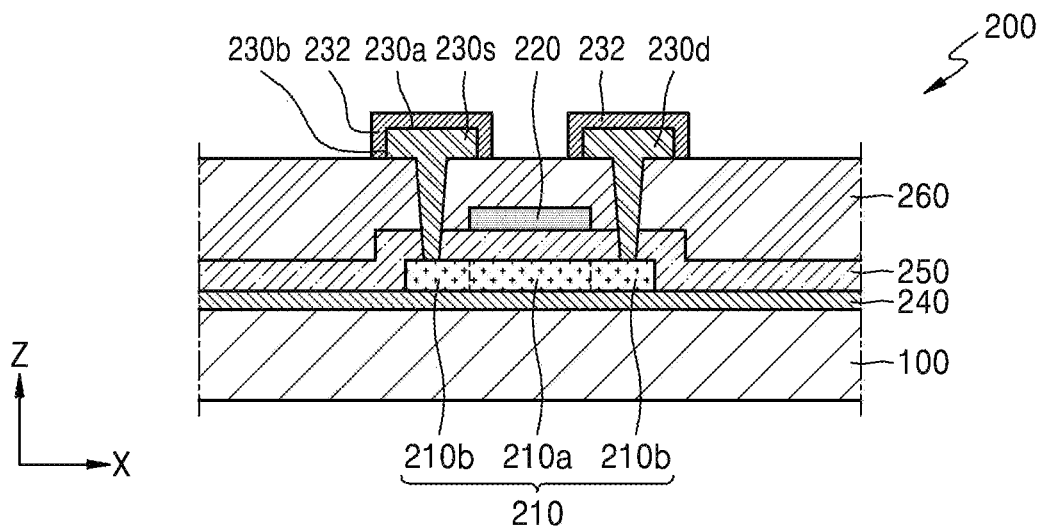
FIG. 1 is a cross-sectional view of an exemplary embodiment of a thin-film transistor structure of a display device according to the invention.

Reference will now be made in detail to exemplary embodiments, examples of which are illustrated in the accompanying drawings, where like reference numerals refer to like elements throughout. In this regard, the exemplary embodiments may have different forms and should not be construed as being limited to the descriptions set forth herein. Accordingly, the exemplary embodiments are merely described below, by referring to the figures, to explain features of the present description.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be understood that the terms such as "include," "comprise" and "have" used herein specify the presence of stated features or components, but do not preclude the presence or addition of one or more other features or components.

It will be further understood that when a layer, region, or component is referred to as being related to another element such as being "on" another layer, region, or component, it can be directly or indirectly on the other layer, region, or component. That is, for example, intervening layers, regions, or components may be present. In contrast, when a layer, region, or component is referred to as being related to another element as being "directly on" another layer, region, or component, no intervening layers, regions, or components are present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of components in the drawings may be exaggerated for convenience of explanation. In other words, since sizes and thicknesses of components in the drawings are arbitrarily illustrated for convenience of explanation, the following embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An x-axis, a y-axis and a z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As a self-emissive display device, an organic light-emitting display device using an active matrix-type display substrate provided with a thin-film transistor (referred to as TFT) for each pixel electrode has been actively studied since the organic light-emitting display device has higher image quality than a simple matrix-type display device. Also, a so-called driving circuit built-in organic light-emitting display device, in which a TFT as a pixel switching element and a driving circuit are disposed on an identical single glass substrate, has been proposed and studied by paying attention to the fact that mobility of a polysilicon (p-Si) TFT is higher than that of an amorphous silicon (a-Si) TFT by one digit to two digits or more.

A structure of the TFT described above may also be used for a display device which is not self-emissive such as a liquid crystal display device, as well as the self-emissive organic light-emitting display device.

However, according to a conventional display device and a method of manufacturing the same, electrodes of a TFT are not uniformly formed due to a process method thereof.

FIG. 1 is a cross-sectional view of an exemplary embodiment of a thin-film transistor structure of a display device according to the invention.

The display device and components thereof are disposed in a plane defined by first and second directions crossing each other. Referring to FIG. 1, for example, the first direction may be an x-axis direction and the second direction may be a y-axis direction (e.g., into the page/view of FIG. 1). A thickness of the display device and components thereof is taken in a third direction crossing each of the first and second directions. Referring again to FIG. 1, for example, the third direction may be a z-axis direction. Related to the cross-sectional structure shown in FIG. 1, a top plan view of the display device or components thereof is a view of the plane defined by the x-axis and the y-axis directions, e.g., a view along the thickness direction.

Referring to FIG. 1, the display device according to an exemplary embodiment includes a (base) substrate 100, an active layer 210 on the substrate 100, a gate electrode 220 over the active layer 210 to at least partially overlap the active layer 210, a source electrode 230s and a drain electrode 230d which are over the gate electrode 220 and are electrically connected to the active layer 210 and include a first metal material, and a first capping layer 232 on the source electrode 230s and the drain electrode 230d to cover the source electrode 230s and the drain electrode 230d.

The substrate 100 may include or be formed of various materials such as a glass material, a metal material, or a plastic material such as polyethylene terephthalate ("PET"), polyethylene naphthalate ("PEN") and polyimide ("PI").

A buffer layer 240 is on an upper surface of the substrate 100 in some exemplary embodiments. The buffer layer 240 is disposed or formed to planarize a surface of the substrate 100 and/or reduce or effectively prevent impurities from penetrating into the active layer 210 of a thin-film transistor ("TFT") 200 and an organic light-emitting diode ("OLED") 160 (of FIG. 3) on the substrate 100. The buffer layer 240 may include a monolayer structure or a multilayer structure of a material such as silicon oxide, silicon nitride or the like. The active layer 210 may be located on the buffer layer 240 including silicon oxide, silicon nitride or the like.

The TFT 200 and a capacitor (not shown) may be on the buffer layer 240. The TFT 200 may include the active layer 210 including amorphous silicon, polysilicon or an organic semiconductor material, together with the gate electrode 220, the source electrode 230s and the drain electrode 230d, and the first capping layer 232.

In the exemplary embodiment, the active layer 210 may include a first region 210a overlapping the gate electrode 220 and a second region 210b not overlapping the gate electrode 220. Portions of the second region 210b may be disposed at opposing sides of the first region 210a. The second regions 210b at the opposing sides of the first region 210a may be regions doped with the same concentration of impurities as that of the first region 210a. The first region 210a and the second region 210b may be directly connected to each other to form a single active layer 210. The fact that the first region 210a and the second region 210b are directly connected to each other can be understood that a less-doped region ("LDD") does not exist between the first region 210a and the second region 210b of the active layer 210. In an exemplary embodiment of manufacturing a display device, the first and second regions 210a and 210b may be formed from a same material layer and be doped with a same concentration of impurities.

The gate electrode 220 is arranged over the active layer 210. In operating the TFT 200, the source electrode 230s and the drain electrode 230d are electrically connected to each other according to a signal applied to the gate electrode 204. The gate electrode 220 may include a monolayer structure or a multilayer structure of a material such as aluminum (Al), platinum (Pt), palladium (Pd), silver (Ag), gold (Au), nickel (Ni), neodymium (Nd), chromium (Cr), lithium (Li), calcium (Ca), molybdenum (Mo), titanium (Ti), tungsten (W) and copper (Cu) considering adhesion with an adjacent layer, surface flatness of a layer to be stacked and/or workability.

Here, a gate insulating layer 250 including or made of silicon oxide and/or silicon nitride may be between the active layer 210 and the gate electrode 220 in order to ensure insulation between the active layer 210 and the gate electrode 220.

An interlayer dielectric layer 260 may be arranged on the gate electrode 220. The interlayer dielectric layer 260 may include a monolayer structure or a multilayer structure of a material such as silicon oxide or silicon nitride.

The source electrode 230s and the drain electrode 230d are on the interlayer dielectric layer 260. The source electrode 230s and the drain electrode 230d are electrically connected to the active layer 210 through and at a contact hole defined in the interlayer dielectric layer 260 and the gate insulating layer 250, respectively. The source electrode 230s and the drain electrode 230d may include a monolayer structure or a multilayer structure of at least one of Al, Pt, Pd, Ag, Au, Ni, Nd, Cr, Li, Ca, Mo, Ti, W and copper Cu considering conductivity and the like.

Although not shown in FIG. 1, a protective film (not shown) for covering the TFT 200 may be arranged to protect the TFT 200 having such a structure as described above. The protective film may include or be formed of an inorganic material such as silicon oxide, silicon nitride or silicon oxynitride.

The first capping layer 232 may be located on the source electrode 230s and the drain electrode 230d of the TFT 200 according to an exemplary embodiment. Each of the source electrode 230s and the drain electrode 230d has an upper surface 230a and a side surface 230b which is connected to the upper surface 230a. The first capping layer 232 may cover both the upper surface 230a and the side surface 230b of each of the source electrode 230s and the drain electrode 230d. The fact that the first capping layer 232 completely covers the upper surface 230a and the side surface 230b of each of the source electrode 230s and the drain electrode 230d can be understood that the source electrode 230s and the drain electrode 230d, which are on the interlayer dielectric layer 260, are sealed by the first capping layer 232 such that no portion of the source electrode 230s and the drain electrode 230d is exposed outside the first capping layer 232 or the interlayer dielectric layer 260.

The first capping layer 232 sealing the source electrode 230s and the drain electrode 230d may cover the upper surface 230a and the side surface 230b of each of the source electrode 230s and the drain electrode 230d, and may extend to an upper surface of the interlayer dielectric layer 260. An end of the first capping layer 232 may be in direct contact with the upper surface of the interlayer dielectric layer 260.

The source electrode 230s and the drain electrode 230d of the TFT 200 may include a first metal material and the first capping layer 232 may include a second metal material. In the exemplary embodiment, the second metal material may have a Young's modulus greater than that of the first metal material. While the source electrode 230s and the drain electrode 230d may include any one of the above-described metal materials, in an exemplary embodiment the source electrode 230s and the drain electrode 230d may include aluminum (Al). Where the first capping layer 232 includes a metal material having a Young's modulus greater than Al of the source electrode 230s and the drain electrode 230d, in an exemplary embodiment the first capping layer 232 may include titanium (Ti), molybdenum (Mo), or tungsten (W).

In general, in the case of a display device, as resolution increases, electrical resistance of metal wirings forming conductive signal lines and the like also increases. Thus, to lower the electrical resistance, such metal wirings may include metal materials having relatively low electrical resistance such as Al. However, during manufacturing of a display device, the metal materials having relatively low resistance such as Al are difficult to apply because of the occurrence of a hillock issue at a relatively high temperature process such as annealing.

As described above, the display device according to the exemplary embodiment may reduce or effectively prevent a hillock of the source electrode 230s and the drain electrode 230d by providing the first capping layer 232 entirely covering the upper surface 230a and the side surface 230b of each of the source electrode 230s and the drain electrode 230d. In addition, during manufacturing of a display device, annealing may be performed at a relatively high temperature of about 350 degrees Celsius (° C.) or higher due to the hillock issue, thereby improving characteristics of a TFT.

Figure 2:
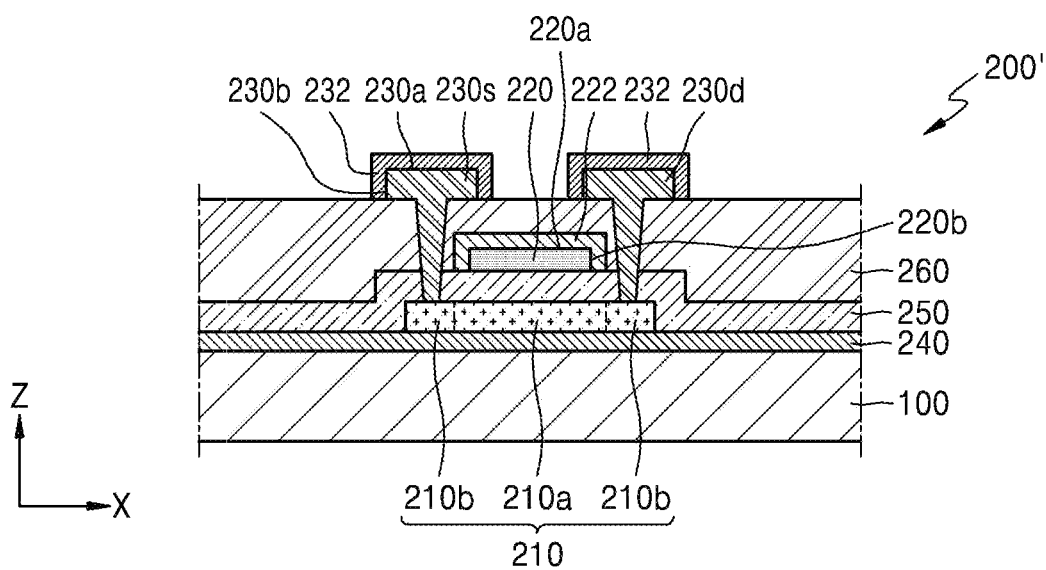
FIG. 2 is a cross-sectional view of another exemplary embodiment of a thin-film transistor structure of a display device according to the invention.

FIG. 2 is a cross-sectional view of another exemplary embodiment of a TFT structure of a display device according to the invention.

Referring to FIG. 2, the display device according to an exemplary embodiment includes the substrate 100, the active layer 210 on the substrate 100, the gate electrode 220 over the active layer 210 to at least partially overlap the active layer 210, the source electrode 230s and the drain electrode 230d which are over the gate electrode 220 and are electrically connected to the active layer 210 and include a first metal material, the first capping layer 232 on the source electrode 230s and the drain electrode 230d to cover the source electrode 230s and the drain electrode 230d, and a second capping layer 222 on the gate electrode 220.

In the present exemplary embodiment, other structures are the same as that of the above-described exemplary embodiment except that the second capping layer 222 is further provided on the gate electrode 220. Hereinafter, differences will be mainly described below.

The second capping layer 222 according to the exemplary embodiment may be arranged to cover the gate electrode 220. The gate electrode 220 may include an upper surface 220a and a side surface 220b which is connected to the upper surface 220a. The second capping layer 222 may be arranged to cover the upper surface 220a and the side surface 220b of the gate electrode 220. As a result, the gate electrode 220 is sealed by the second capping layer 222. The second capping layer 222 may extend to an upper surface of the gate insulating layer 250 such that an end of the second capping layer 222 may be in direct contact with the upper surface of the gate insulating layer 250.

In the exemplary embodiment, the gate electrode 220 may include a first metal material, and the second capping layer 222 may include a second metal material having a Young's modulus greater than that of the first metal material. The first metal material and the second metal material may be any of a number of metal materials as long as the Young's modulus of the second metal material is greater than that of the first metal material. In exemplary embodiments, the first metal material may include Al, and the second metal material may include Ti, Mo or W.

The exemplary embodiment may provide the first capping layer 232 covering the source electrode 230s and the drain electrode 230d. A first metal material forming the source electrode 230s and the drain electrode 230d and a first metal material forming the gate electrode 220 may be the same as each other or different from each other. In addition, the second metal material forming the first capping layer 232 and the second metal material forming the second capping layer 222 may be the same as each other or different from each other.

In general, in the case of a display device, as resolution increases, electrical resistance of metal wirings forming conductive signal lines and the like increases. Thus, to lower the electrical resistance, such metal wiring may include metal materials having relatively low electrical resistance such as Al. However, during manufacturing of a display device the metal materials having relatively low resistance such as Al are difficult to apply because of the occurrence of a hillock issue at a relatively high temperature process such as annealing.

As described above, the display device according to the exemplary embodiment may reduce or effectively prevent a hillock of the source electrode 230s, the drain electrode 230d, and the gate electrode 220 by providing the first capping layer 232 entirely covering the upper surface 230a and the side surface 230b of each of the source electrode 230s and the drain electrode 230d, and the second capping layer 222 entirely covering the upper surface 220a and the side surface 220b of the gate electrode 220. In addition, during manufacturing of a display device, annealing may be performed at a relatively high temperature of about 350° C. or higher due to the hillock issue, thereby improving characteristics of a TFT.

Figure 3:
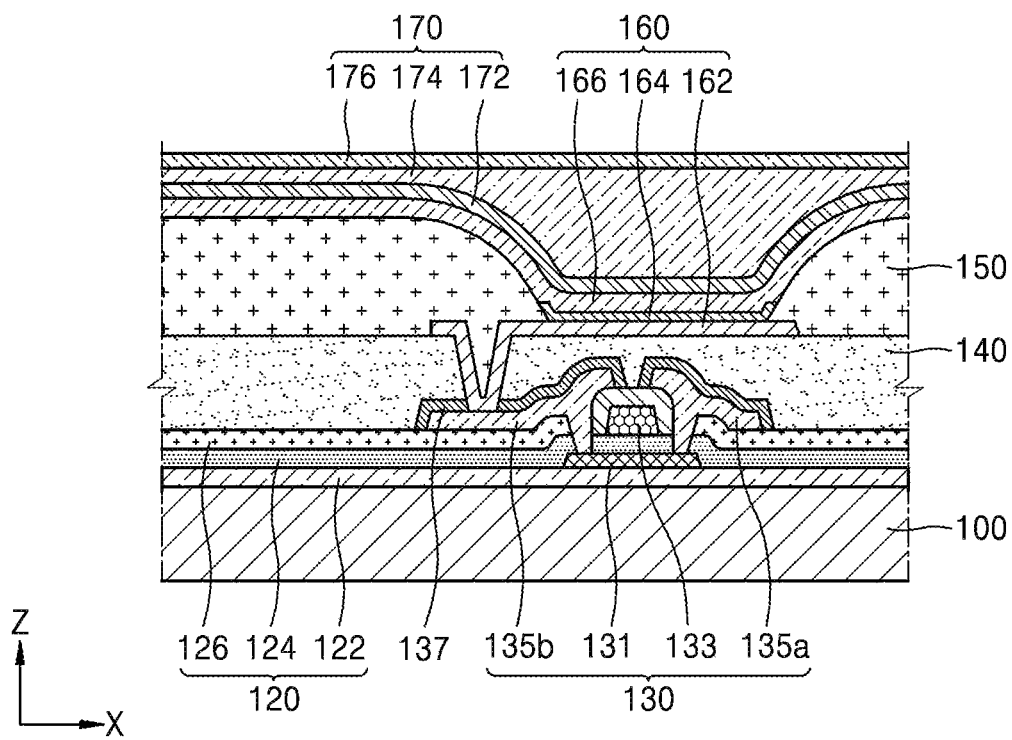
FIG. 3 is a cross-sectional view of an exemplary embodiment of a display device according to the invention.

FIG. 3 is a cross-sectional view of an exemplary embodiment of a display device according to the invention.

Referring to FIG. 3, the display device according to the exemplary embodiment may include the substrate 100, an OLED 160 electrically connected to a TFT 130 arranged on the substrate 100, and an encapsulation layer 170 for sealing the OLED 160 such that no portion thereof is exposed to outside the display device. A structure of the TFT 130 may be the same as that of any one of the above-described exemplary embodiments of a TFT (200 in FIG. 1 or 200' in FIG. 2), and repeated descriptions thereof will be omitted.

Although the exemplary embodiment of FIG. 3 illustrates that the TFT 130 is applied to an organic light-emitting display device as a self-emissive display device, the TFTs 200 and 200' according to one or more exemplary embodiment described herein may be applied to a display device which is not self-emissive such as a liquid crystal display device.

The display device may display an image with light. The display device may include a display area at which the image is displayed and a non-display area at which the image is not displayed. The display area of the display device may include a light-emitting region at which light is emitted to display the image, and a non-display region at which light is not emitted and the image is not displayed. In an exemplary embodiment, the structure of FIG. 3 is disposed in the display area of the display device. A portion of the OLED 160 at which light is generated and/or emitted may be disposed in or define a light-emitting region of the display device. Remaining portions of the structure in FIG. 3 except for the light-emitting region may be disposed in or define the non-display region of the display device.

The OLED 160 may be operated or controlled to generate and emit light for displaying the image by signals applied thereto through the TFT 130. The signals applied to and through the TFT 130 to the OLED 160 may include a power signal, a control signal, a driving signal, a gate signal, an (image) data signal, and the like. The various signals for operating and controlling components within the display device may be generated and/or provided from outside the display device, without being limited thereto.

The TFT 130 may be on the substrate 100. The TFT 130 may include an active layer 131 including amorphous silicon, polycrystalline silicon or an organic semiconductor material, a gate electrode 133, a source electrode 135a and a drain electrode 135b. A capping layer 137 may be arranged on the source electrode 135a and the drain electrode 135b to cover upper and side surfaces of each of the source electrode 135a and the drain electrode 135b. Although the capping layer 137 is arranged only on the source electrode 135a and the drain electrode 135b in the exemplary embodiment, a capping layer (not shown) may also be disposed or formed on the gate electrode 133 in the same manner as in the above-described exemplary embodiment (222 of FIG. 2).

A layer 120 may be on the substrate 100, and may include a buffer layer 122, a gate insulating layer 124 and an interlayer dielectric layer 126. The buffer layer 122 is disposed or formed to planarize a surface of the substrate 100 and/or reduce or effectively prevent impurities from penetrating into the active layer 131 of the TFT 130 and the OLED 160 on the substrate 100. The gate insulating layer 124 including or made of silicon oxide and/or silicon nitride may be between the active layer 131 and the gate electrode 133 in order to ensure insulation between the active layer 131 and the gate electrode 133. The interlayer dielectric layer 126 may be arranged on the gate electrode 133. The interlayer dielectric layer 126 may include a monolayer structure or a multilayer structure of a material such as silicon oxide or silicon nitride.

A planarization layer 140 may be on the TFT 130. As shown in FIG. 3, for example, when the OLED 160 is arranged on the TFT 130, the planarization layer 140 may generally flatten an upper portion such as a protective film (not shown) covering the TFT 130. The planarization layer 140 may include or be formed of an organic material such as acryl, benzocyclobutene ("BCB"), or hexamethyldisiloxane ("HMDSO"). Although the planarization layer 140 is shown as a monolayer structure in FIG. 3, the planarization layer 140 may be a multilayer structure and various modifications may be made.

The OLED 160 may be located on the planarization layer 140. The OLED 160 includes a pixel electrode 162, an opposite electrode 166 and an intermediate layer 164 therebetween and including an emission layer. As shown in FIG. 3, the pixel electrode 162 is electrically connected to the TFT 130 by contacting with one of the source electrode 135a and the drain electrode 135b through or at an opening defined in the planarization layer 140 or the like.

A pixel-defining layer 150 may be on the planarization layer 140. The pixel defining layer 150 defines pixels of the display device by including an opening corresponding to each of sub pixels, that is, an opening exposing at least a center of the pixel electrode 162. The opening may correspond to a light-emitting region of the display device, without being limited thereto. Furthermore, as shown in FIG. 3, the pixel-defining layer 150 reduces or effectively prevents generation of an arc or the like at an edge of the pixel electrode 162 by increasing a distance between the edge of the pixel electrode 162 and the opposite electrode 166 over the pixel electrode 162, along the thickness direction of the display device. The pixel-defining layer 150 may include an organic material such as PI or HMDSO.

The intermediate layer 164 of the OLED 160 may include a relatively low molecular weight material or a relatively high molecular weight material. If the intermediate layer 164 includes a relatively low molecular weight material, the intermediate layer 164 may have a single layer structure or a composite structure by stacking a hole injection layer ("HIL"), a hole transport layer ("HTL"), an emission layer ("EML"), an electron transport layer ("ETL") and an electron injection layer ("EIL"). The intermediate layer 164 may include various organic materials, such as copper phthalocyanine (CuPc), N,N'-Di(naphthalene-1-yl)-N,N'-diphenylbenzidine ("NPB"), and tris-8-hydroxyquinoline aluminum (Alq3). In an exemplary embodiment of manufacturing a display device, the layers may be formed by an evaporation method.

When the intermediate layer 164 includes a polymer material, the intermediate layer 164 may have a structure including an HTL and an EML. The HTL may include poly(3,4-ethylenedioxythiophene) (poly(ethylenedioxythiophene)) and the EML may include a high molecular weight material, such as poly-phenylenevinylene ("PPV") and polyfluorene. In an exemplary embodiment of manufacturing a display device, the intermediate layer 164 may be formed by using a screen printing method, an ink jet printing method, or a laser induced thermal imaging ("LITI") method.

The intermediate layer 164 is not limited thereto, but may have various structures. Also, the intermediate layer 164 may include a one-body layer disposed commonly over a plurality of pixel electrodes 162 or may have a layer patterned to discretely correspond respectively to each of the pixel electrodes 162.

The opposite electrode 166 may be on the intermediate layer 164. The opposite electrode 166 may be integrally formed to be disposed commonly over a plurality of pixel electrodes 162 to commonly correspond to the plurality of the pixel electrodes 162.

Since the OLED 160 is easily damaged by moisture or oxygen which may be incident thereto from outside the display device, the encapsulation layer 170 may cover and protect the OLED 160. The encapsulation layer 170 may be arranged over the entire surface of the substrate 100 and extend to an edge of the substrate 100. The encapsulation layer 170 may include a first inorganic encapsulation layer 172, an organic encapsulation layer 174 and a second inorganic encapsulation layer 176, as shown in FIG. 3.

The first inorganic encapsulation layer 172 covers the opposite electrode 166, and may include silicon oxide, silicon nitride, and/or silicon oxynitride. If necessary, another layer, for example, a capping layer (not shown) may be between the first inorganic encapsulation layer 172 and the opposite electrode 166.

Since the first inorganic encapsulation layer 172 is disposed or formed along the profile or shape of underlying structures, an upper surface of the first inorganic encapsulation layer 172 is not flat as shown in FIG. 3. The organic encapsulation layer 174 covers the first inorganic encapsulation layer 172 having the non-flat upper surface. However, unlike the first inorganic encapsulation layer 172, an upper surface of the organic encapsulation layer 174 may generally be formed flat to planarize the profile or shape of the underlying structures. The organic encapsulation layer 174 may include at least one selected from PET, PEN, polycarbonate ("PC"), PI, poly(ether sulfones ("PES"), polyoxymethylene ("POM"), polyarylate ("PAR") and HMDSO.

The second inorganic encapsulation layer 176 covers the organic encapsulation layer 174 and may include silicon oxide, silicon nitride and/or silicon oxynitride. The second inorganic encapsulation layer 176 may reduce or effectively prevent the organic encapsulation layer 174 from being exposed to outside the display device because the second inorganic encapsulation layer 176 contacts the first inorganic encapsulation layer 172 at the edge of the substrate 100 where the organic encapsulation layer 174 terminates to seal the organic encapsulation layer 174 between the second inorganic encapsulation layer 176 and the first inorganic encapsulation layer 172.

In this manner, since the encapsulation layer 170 has a multilayer structure including the first inorganic encapsulation layer 172, the organic encapsulation layer 174 and the second inorganic encapsulation layer 176, even if a crack occurs in the encapsulation layer 170, the crack may not be connected between the first inorganic encapsulation layer 172 and the organic encapsulation layer 174, or between the organic encapsulation layer 174 and the second inorganic encapsulation layer 176 through the multilayer structure. In this manner, the formation of a penetration path through which external moisture or oxygen penetrates into the display unit may be effectively prevented or minimized.

Although only a display device has been described so far, the invention is not limited thereto. A method of manufacturing such a display device is also within the scope of the present disclosure.

FIGS. 4 to 8 are cross-sectional views of an exemplary embodiment of a method of manufacturing a display device according to the invention.

FIGS. 4 to 8 show cross-sectional structures during a manufacturing process of forming a capping layer covering a source electrode and drain electrode and/or a gate electrode illustrated in the above-described exemplary embodiments. Such a manufacturing process is not limited to the capping layer covering the source electrode and the drain electrode and/or the gate electrode, but may also be applied to a manufacturing process of generally forming a first conductive layer 20 and a second conductive layer 30 which covers the first conductive layer 20. The first conductive layer 20 may for a conductive wiring within a display device, without being limited thereto.

Additionally, FIGS. 4 to 8 show that a photoresist layer 10 and the first conductive layer 20 are directly formed on the substrate 100 for convenience of illustration. However, in an actual process, a buffer layer and/or an insulating layer or the like may be formed on the substrate 100, and then the photoresist layer 10 and the first conductive layer 20 may be formed thereon to dispose the buffer layer and/or an insulating layer between the substrate 100 and the photoresist layer 10.

Figure 4:
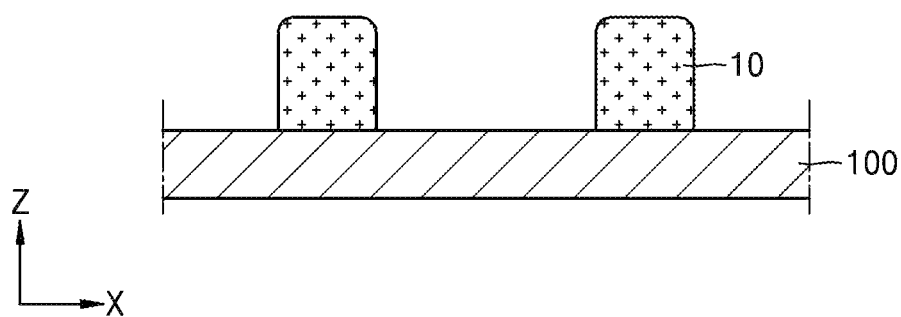
FIGS. 4 to 8 are cross-sectional views of an exemplary embodiment of a method of manufacturing a display device according to the invention.

Referring first to FIG. 4, the photoresist layer 10 may be formed on the substrate 100. The photoresist layer 10 may be formed by first applying a photosensitive material on the substrate 100 and patterning the same to form portions of the photoresist layer 10 spaced apart from each other and exposing the upper surface of the substrate 100 therebetween.

Figure 5:
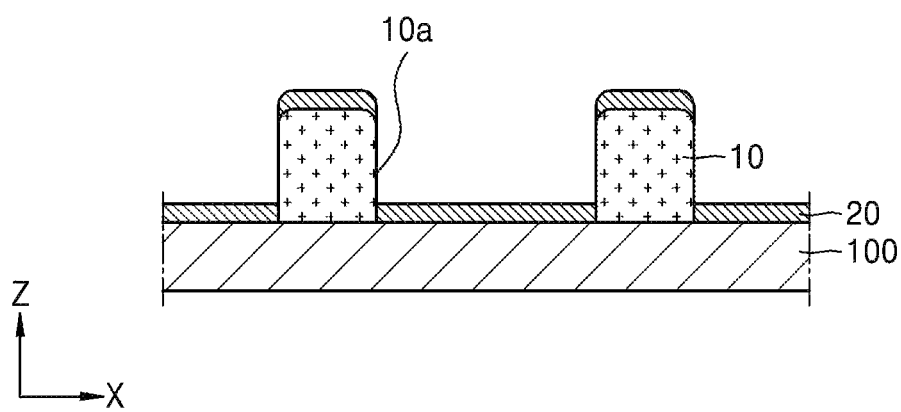

Referring to FIG. 5, the first conductive layer 20 including a first metal material may be formed on the photoresist layer 10 and on exposed portions of the substrate 100. As described above, the first conductive layer 20 may be a gate electrode, a source electrode and/or drain electrode of a TFT, but the present disclosure is not limited thereto. The first conductive layer 20 can be applied as any of a number of conductive elements within a display device according to exemplary embodiments such as a metal wiring for which a hillock occurs during a conventional method of manufacturing such metal wiring.

In an exemplary embodiment, for example, the first metal material forming the first conductive layer 20 may include at least one selected from Al, Pt, Pd, Ag, Mg, Au, Ni, Nd, Ir, Cr, Li, Ca, Mo, Ti, W and Cu, and may include a monolayer structure or a multilayer structure.

In forming the first conductive layer 20 on the photoresist layer 10, the patterned photoresist layer 10 has an upper surface and a side surface 10a which is connected to the upper surface. The first conductive layer 20 may be formed only on the upper surface of the resist layer 10 and not on the side surface 10a, as illustrated in FIG. 2. That is, a portion of the first conductive layer 20 may be formed on the upper surface of the photoresist layer 10 to be separated from another portion of the first conductive layer 20 at the exposed surface of the substrate 100 by a height difference equal to the height of the photoresist layer 10 from the substrate 100. The side surface 10a of the photoresist layer 10 may be exposed from the first conductive layer 20 owing to the separated portions thereof.

Figure 6:
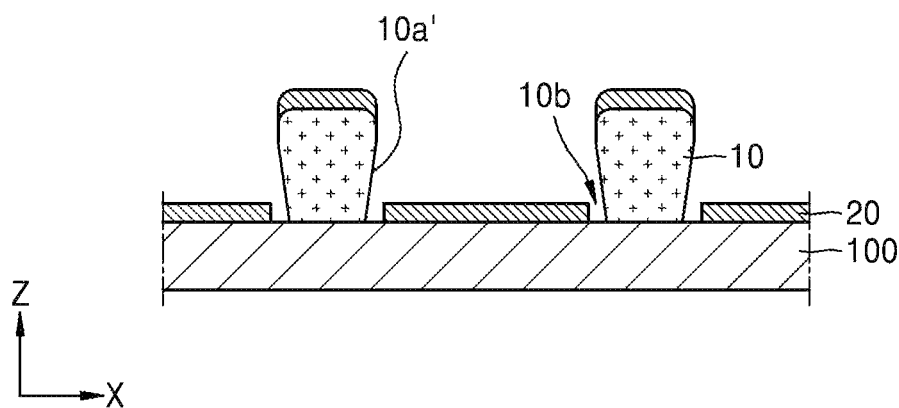

Referring to FIG. 6, a side surface 10a of the photoresist layer 10 may be etched. The etching of the side surface 10a of the photoresist layer 10 does not mean etching only the side surface 10a of the photoresist layer 10 separately. Since the side surface 10a of the photoresist layer 10 is not covered by the first conductive layer 20 but is exposed outside the first conductive layer 20, the side surface 10a of the photoresist layer 10 may be naturally etched during the etching process.

As the side surface 10a of the photoresist layer 10 is etched and a portion thereof is removed to form the etched side surface 10a', the photoresist layer 10 may have an inverted trapezoidal shape in which a width of a portion closest to the substrate 100 becomes narrower than a remaining portion further from the substrate 100 as shown in FIG. 6. In addition, as the side surface 10a of the photoresist layer 10 is etched to form side surface 10a', a space 10b may be defined between the etched side surface of the photoresist layer 10 and the first conductive layer 20.

Portions of the first conductive layer 20 are spaced apart from each other and from portions of the etched photoresist layer 10 having the etched side surface 10a'. The spaced apart portions of the first conductive layer 20 may form a gate electrode, a source electrode and/or drain electrode of a TFT, but the present disclosure is not limited thereto. The spaced apart portions of the first conductive layer 20 can be applied as any of a number of conductive elements within a display device according to exemplary embodiments such as a metal wiring for which a hillock occurs during a conventional method of manufacturing such metal wiring.

Figure 7:
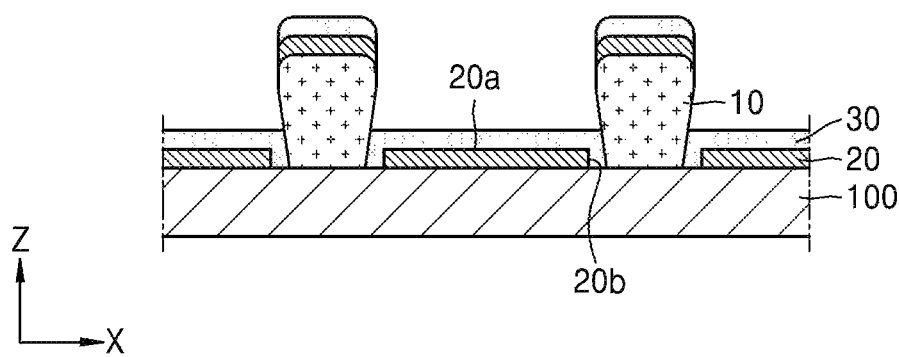

Referring FIG. 7, the second conductive layer 30 may be formed on the first conductive layer 20 on the first photoresist layer 10 having the etched side surface 10a'. The second conductive layer 30 may include a second metal material, and the second metal material may have a Young's modulus greater than that of the first metal material forming the first conductive layer 20. As shown in FIG. 7, the second conductive layer 30 may be formed on the first conductive layer 20, and in some exemplary embodiments, a portion of the etched side surface 10a' of the photoresist layer 10 may be exposed outside the second conductive layer 30 during the process.

The second conductive layer 30 may be formed to fill the space 10b (of FIG. 6) between the etched photoresist layer 10 and the first conductive layer 20, the space 10b being formed as the side surface 10a (of FIG. 5) of the photoresist layer 10 is etched. That is, the second conductive layer 30 may cover both an upper surface 20a and a side surface 20b of the first conductive layer 20 on the substrate 100 at areas of the substrate 100 on which the photoresist layer 10 is not formed. The second conductive layer 30 may be filled between patterned portions of the photoresist layer 10 spaced apart from each other (of FIG. 4) which expose areas of the substrate 100.

Figure 8:
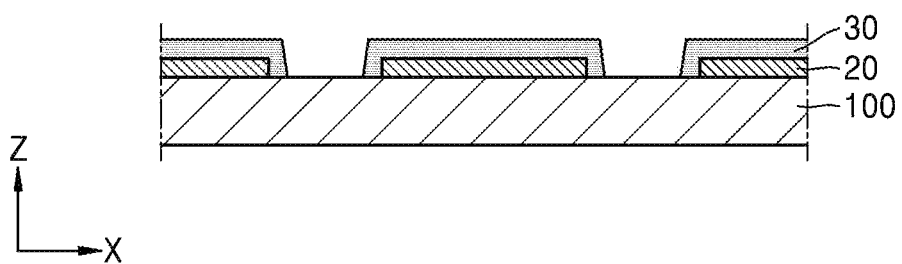

Referring to FIG. 8, the photoresist layer 10 may be removed. As the photoresist layer 10 is removed, portions of the first conductive layer 20 and the second conductive layer 30 that have been formed on the upper surface of the photoresist layer 10 are removed along with the photoresist layer 10 having the etched surface 10a'. A film under the photoresist layer 10 and/or the first conductive layer 20, such as a buffer layer and/or an insulating layer or the like may be exposed to outside the first and second conductive layers 20 and 30 during the process of removing the photoresist layer 10.

After the photoresist layer 10 is removed together with the portions of the first and second conductive layers 20 and 30 on the upper surface thereof, a structure may be formed in which the second conductive layer 30 covers both the upper surface 20a (of FIG. 7) and the side surface 20b (of FIG. 7) of the first conductive layer 20.

In a conventional method of manufacturing a conductive layer covers the entirety of an underlying conductive element, at least two photolithography processes are required. However, in one or more exemplary embodiment of the method of manufacturing a display device according to the invention as described above, the second conductive layer 30 covers both the entire upper surface 20a and the side surface 20b of the first conductive layer 20 through one process so that the process of manufacturing a conductive layer covering an underlying conductive element can be remarkably simplified.

According to one or more exemplary embodiment as described above, a display device including a TFT with improved function and reliability and a simplified manufacturing process thereof, and a method of manufacturing the same may be realized. However, the scope of the disclosure is not limited to the effect.

It should be understood that exemplary embodiments described herein should be considered in a descriptive sense only and not for purposes of limitation. Descriptions of features within each exemplary embodiment should typically be considered as available for other similar features in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
    forming a photoresist layer on a substrate by applying and patterning a photosensitive material on the substrate, the photoresist layer exposing first portions of the substrate;
    forming a first conductive layer on the photoresist layer and the first portions of the substrate, the first conductive layer comprising a first metal material;
    etching a side surface of the photoresist layer having the first conductive layer thereon to expose second portions of the substrate;
    forming a second conductive layer on the first conductive layer on the photoresist layer of which the side surface is etched, on the first conductive layer on the first portions of the substrate, and on the second portions of the substrate, the second conductive layer comprising a second metal material having a Young's modulus greater than that of the first metal material; and
    removing the photoresist layer to form the second conductive layer covering the first conductive layer on the first portions of the substrate, the first conductive layer covered by the second conductive layer forming a conductive wiring of the display device.

2. The method of claim 1, wherein
the first conductive layer comprises aluminum (Al).

3. The method of claim 1, wherein
the second conductive layer comprises titanium (Ti), molybdenum (Mo) or tungsten (W).

4. The method of claim 1, wherein
the photoresist layer exposing first portions of the substrate includes an upper surface and the side surface, the side surface extending from the upper surface, and
in the forming of the first conductive layer, the first conductive layer is disposed on the upper surface of the photoresist layer and on the first portions of the substrate to expose the side surface of the photoresist layer from the first conductive layer.

5. The method of claim 1, wherein
after the etching of the side surface of the photoresist layer, a space is defined between the etched side surface of the photoresist layer and the first conductive layer on the first portions of the substrate.

6. The method of claim 1, wherein
the first conductive layer on the first portions of the substrate includes an upper surface and a side surface which extends from the upper surface, and
in the forming of the second conductive layer, the second conductive layer is disposed on the upper surface of the first conductive layer and extends along the side surface thereof to cover both the upper surface and the side surface of the first conductive layer on the first portions of the substrate.

7. The method of claim 1, wherein
the first conductive layer comprising the first metal material covered by the second conductive layer comprising the second metal material forms a gate electrode, a source electrode or a drain electrode of a thin-film transistor of the display device.

8. The method of claim 7, further comprising forming the thin-film transistor of the display device on the substrate, the forming of the thin-film transistor comprising:
forming an active layer on the substrate;
forming the gate electrode on the active layer, wherein the gate electrode is disposed overlapping a first region of the active layer and disposed non-overlapping with a second region of the active layer;
doping the second region of the active layer with a same concentration of impurities as that of a first region of the active layer; and
forming the source electrode and the drain electrode electrically connected to the active layer on the gate electrode,
wherein the gate electrode, the source electrode and the drain electrode are formed by respective portions of the first conductive layer comprising the first metal material covered by the second conductive layer comprising the second metal material.

9. The method of claim 8, wherein
the first region and the second region are directly connected to each other.

* * * * *